United States Patent
Regev et al.

(10) Patent No.: US 9,497,540 B2
(45) Date of Patent: Nov. 15, 2016

(54) SYSTEM AND METHOD FOR REDUCING RUB AND BUZZ DISTORTION

(75) Inventors: Shlomi I. Regev, Irvine, CA (US); Trausti Thormundsson, Irvine, CA (US); Harry K. Lau, Norwalk, CA (US); James W. Wihardja, Fullerton, CA (US)

(73) Assignee: CONEXANT SYSTEMS, INC., Irvine, CA (US)

( * ) Notice: Subject to any disclaimer, the term of this patent is extended or adjusted under 35 U.S.C. 154(b) by 983 days.

(21) Appl. No.: 12/963,443

(22) Filed: Dec. 8, 2010

(65) Prior Publication Data

US 2011/0188670 A1 Aug. 4, 2011

Related U.S. Application Data

(60) Provisional application No. 61/290,001, filed on Dec. 23, 2009.

(51) Int. Cl.
| | |
|---|---|
| *H04B 15/00* | (2006.01) |
| *G06F 17/00* | (2006.01) |
| *H04R 3/00* | (2006.01) |
| *H03G 3/20* | (2006.01) |
| *H03G 3/32* | (2006.01) |
| *H03G 5/16* | (2006.01) |
| *H04R 29/00* | (2006.01) |

(52) U.S. Cl.
CPC ............... *H04R 3/00* (2013.01); *H04R 3/007* (2013.01); *H03G 3/20* (2013.01); *H03G 3/32* (2013.01); *H03G 5/165* (2013.01); *H04R 29/001* (2013.01)

(58) Field of Classification Search
CPC ........ H04R 3/00; H04R 3/007; H04R 11/00; H04R 3/04; H04R 2499/11; H03G 3/20; H03G 3/32; H03G 5/165
USPC .......... 381/94.1, 111, 116, 94.5, 97–109, 96; 700/94
See application file for complete search history.

(56) References Cited

U.S. PATENT DOCUMENTS

| | | | | |
|---|---|---|---|---|
| 4,410,764 | A | * | 10/1983 | Werth et al. ................... 704/203 |
| 4,856,068 | A | * | 8/1989 | Quatieri, Jr. ............ G10L 19/02 |
| | | | | 381/106 |
| 4,888,808 | A | * | 12/1989 | Ishikawa et al. .............. 381/103 |
| 5,091,957 | A | * | 2/1992 | Anderson et al. ............. 381/106 |

(Continued)

FOREIGN PATENT DOCUMENTS

| | | |
|---|---|---|
| CN | 101390441 A | 3/2009 |
| JP | 2004-297707 A | * 10/2004 |

(Continued)

OTHER PUBLICATIONS

Klippel, Measurement of Impulsive Distortion, Rub and Buzz and Other Disturbances, AES,2003.*

(Continued)

*Primary Examiner* — Davetta W Goins
*Assistant Examiner* — Kuassi Ganmavo
(74) *Attorney, Agent, or Firm* — Haynes and Boone, LLP

(57) ABSTRACT

An audio driver with reduced rub and buzz distortion that includes a digital processing module. A digital to audio converter (DAC) operable to receive a digital audio signal supplied by the digital processing module. One or more analog driver stages operable to receive an analog audio signal supplied by the DAC. A peak amplitude compressor.

16 Claims, 5 Drawing Sheets

(56) References Cited

U.S. PATENT DOCUMENTS

| | | | |
|---|---|---|---|
| 5,673,326 A * | 9/1997 | Goldfarb | 381/99 |
| 5,784,476 A * | 7/1998 | Bird | 381/107 |
| 6,112,169 A * | 8/2000 | Dolson | 704/205 |
| 6,201,873 B1 | 3/2001 | Dal Farra | |
| 6,570,514 B1 * | 5/2003 | Velazquez | 341/118 |
| 7,359,519 B2 * | 4/2008 | Lee et al. | 381/59 |
| 7,406,178 B2 * | 7/2008 | Jiang et al. | 381/107 |
| 7,719,362 B2 * | 5/2010 | Hossack et al. | 330/282 |
| 7,778,427 B2 * | 8/2010 | Klayman | 381/97 |
| 7,945,342 B2 * | 5/2011 | Tsai et al. | 700/94 |
| 8,036,402 B2 * | 10/2011 | Furge | 381/120 |
| 8,081,779 B2 * | 12/2011 | Kuroda | H03F 1/32 381/111 |
| 8,275,151 B2 * | 9/2012 | Caramma | 381/97 |
| 8,306,241 B2 * | 11/2012 | Kim et al. | 381/94.3 |
| 2003/0228025 A1 * | 12/2003 | Hannah | H04R 3/00 381/113 |
| 2005/0065784 A1 * | 3/2005 | McAulay | G10L 19/093 704/205 |
| 2007/0019803 A1 * | 1/2007 | Merks et al. | 379/406.08 |
| 2007/0223724 A1 * | 9/2007 | Miyazaki | H04R 3/00 381/77 |
| 2009/0271186 A1 * | 10/2009 | LeBlanc et al. | 704/226 |
| 2009/0274315 A1 * | 11/2009 | Carnes et al. | 381/66 |
| 2012/0300949 A1 * | 11/2012 | Rauhala et al. | 381/55 |

FOREIGN PATENT DOCUMENTS

| | | | |
|---|---|---|---|
| JP | 2004297707 A | * | 10/2004 |
| WO | 2012/009670 A2 | | 1/2012 |

OTHER PUBLICATIONS

Broughton et al, Discrete Fourier Analysis and Wavelets, Application to Signal and image processing, 2008.*

Munezumi, JP 2004297707 A Translation, 2004.*

European Patent Office; International Preliminary Report on Patentability; PCT Application No. PCT/US2010/061827; Oct. 2, 2012.

European Patent Office; International Search Report and Written Opinion; PCT Application No. PCT/US2010/061827; Sep. 6, 2012.

Taiwan Patent Office; Office Action; Taiwan Application No. 099144830; Mar. 7, 2014.

Taiwan Patent Office; Office Action (English translation); Taiwan Application No. 099144830; Mar. 7, 2014.

* cited by examiner

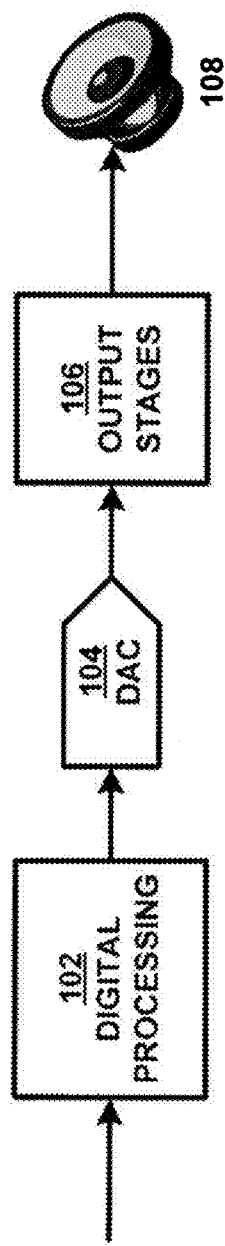
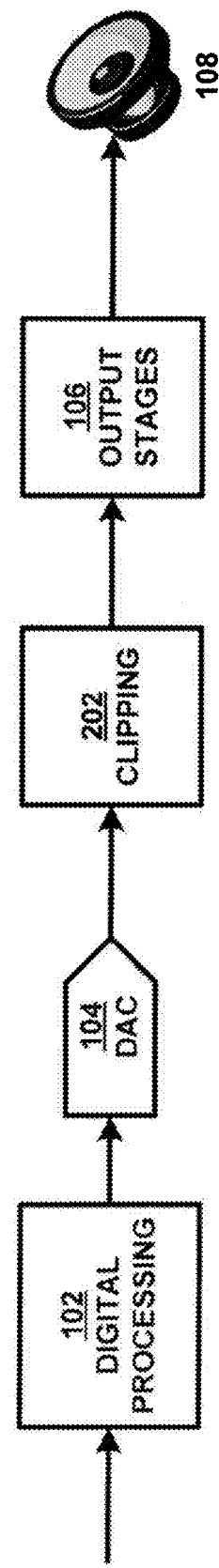

SYSTEM AND METHOD FOR REDUCING RUB AND BUZZ DISTORTION

RELATED APPLICATIONS

The present application claims priority to U.S. provisional application Ser. No. 61/290,001, filed Dec. 23, 2009, which is hereby incorporated by reference for all purposes.

FIELD OF THE INVENTION

The present invention relates generally to audio noise reduction, and more specifically to the prevention of rub and buzz distortion.

BACKGROUND OF THE INVENTION

Rub and buzz is a particular type of sound distortion which originates in mechanical faults in loudspeakers (as used herein, speaker and loudspeaker may be used interchangeably). Also referred to as "triggered distortion" in the literature, rub and buzz is an impulsive and unwanted form of non-linear distortion, which is both annoying to the listener and may even damage the loudspeaker. Furthermore, rub and buzz is problematic because it is not easily measurable using normal techniques such as total harmonic distortion (THD) analysis or root-mean-square (RMS) fast Fourier transform (FFT) testing, and therefore often requires human intervention to detect. Rub and buzz distortion is typically caused by mechanical or structural defects in speakers, for example, a misaligned voice coil that rubs due to a bent surround or a loose spider.

FIG. 1 is a diagram of a typical prior art audio output system that includes digital processing module 102, which can have digital filters, digital equalizers and other digital circuitry used to process audio signals. FIG. 1 further includes digital to analog converter (DAC) 104, analog output stages 106 which typically comprise an amplifier and output driver which drives speaker 108. However, no circuitry is available to address the problem of rub and buzz sound distortion.

SUMMARY OF INVENTION

One of the difficulties in detecting rub and buzz distortion is that, contrary to other types of speaker nonlinearities, it is often manifested as high order harmonics of the fundamental (desired) signal. This periodic high frequency content is more irritating to the human ear than lower harmonics that characterize amplifier distortion or other loudspeaker nonlinearities. Conventional Total Harmonic Distortion tests may not detect rub and buzz, because they do not take into consideration the order of the harmonics when diagnosing the problem. Techniques for determining rub and buzz, on the other hand, focus on examining the power of the high order harmonics that the loudspeaker produces as a response to a given test signal.

At present, specialized tests are used to detect rub and buzz distortion in a speaker produced in a factory. When a speaker exhibits significant rub and buzz, it is discarded as part of the manufacturer's quality assurance process. However, it has been recognized by the inventors that speakers in many applications, such as automotive loudspeakers, are subjected to many stresses and strains while in use, so that structural or mechanical defects can be introduced over the course of time. Based on the recognition of this problem, it has been determined that the need exists to electronically address the problem of rub and buzz distortion in a speaker over time, and not just at the factory.

In one exemplary embodiment, the disclosed system and method for minimizing the occurrence of rub and buzz distortion is based on the assumption that rub and buzz noise is created when the loudspeaker displacement exceeds a given threshold. This assumption has been corroborated by empirical evidence, and can be explained by the fact that the distortion is caused by a mechanical constriction that inhibits the speaker's movement. Because the loudspeaker displacement can vary in frequency, one exemplary embodiment of the algorithm for correcting rub and buzz distortion utilizes the displacement transfer function, where the total displacement at any given time can be calculated from the input signal alone.

Techniques such as clipping, automatic gain control, phase modification, or a combination thereof can be used to minimize the incidence of rub and buzz distortion. In one exemplary embodiment, a phase modification system compresses the peak amplitude of the audio signal without changing its spectral characteristics, where individual sinusoidal tracks in speech are monitored. In another exemplary embodiment, tracks with low power are discarded. In yet another exemplary embodiment, the overall signal is attenuated based on the peak amplitude after the phase modification.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 1 is a diagram of a typical prior art audio output system;

FIG. 2 is a diagram of a clipping circuit in an audio path in accordance with an exemplary embodiment of the present invention;

DETAILED DESCRIPTION

Figures 3A, 3B:
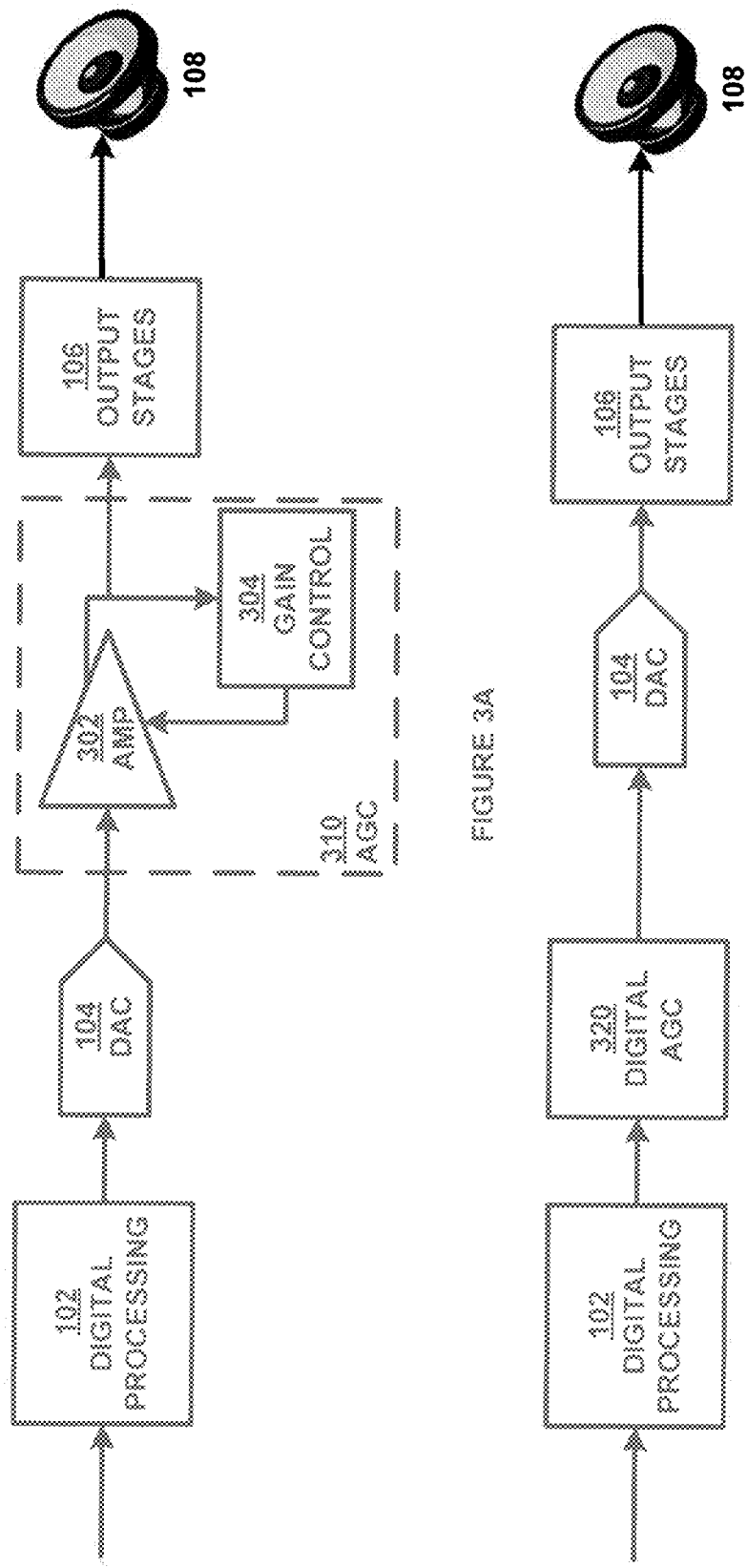
FIG. 3A is a diagram of a basic analog implementation of automatic gain control (AGC) in an audio path in accordance with an exemplary embodiment of the present invention.
FIG. 3B is a diagram of a digital implementation of an AGC in accordance with an exemplary embodiment of the present invention.

A detailed description of embodiments of the present invention is presented below. While the disclosure will be described in connection with these drawings, there is no intent to limit it to the embodiment or embodiments disclosed herein. On the contrary, the intent is to cover all alternatives, modifications and equivalents included within the spirit and scope of the disclosure.

Rub and buzz can be created by a mechanical fault that disturbs the normal movement of the loudspeaker's cone. This disruption can result in an impulsive non-linear interference whenever the cone is displaced by a certain distance(s) from its point of origin. The rub and buzz can be ameliorated by decreasing the signal peak amplitude, so as to avoid the disturbance. In one exemplary embodiment, attenuation, dynamic range compression or automatic gain control can be used to result in a decrease in loudness, but this approach is undesirable in practical applications.

Because the human hearing mechanism is somewhat insensitive to differences in the phase of a signal, two waveforms with a completely different waveform envelope may be indistinguishable to a human listener. This allows the peak amplitude to be reduced by separating the signal into overlapping windowed frames, analyzing the signal in each frame as a collection of sine waves at different amplitudes, frequencies and phases, altering the phases of the sine waves so that the sum of the modified sine waves will have an envelope that has lower peaks, and then combining the modified sine waves to synthesize a signal that is more dispersed, while maintaining the magnitude response of the signal. In this manner, the spectral shape or the gain of the signal is not changed, and the change in phase will result in an acceptable level of reduced distortion.

Common forms of non-linearity are studied almost exclusively in the frequency domain, using measurements such as Total Harmonic Distortion (THD). Based on the assumption that rub and buzz occurs when the loudspeaker reaches a certain peak displacement and that the displacement of the loudspeaker isn't constant across frequencies, it follows that rub and buzz has both time and frequency domain aspects that should be taken into account when searching for a solution.

Another characteristic of rub and buzz is that it tends to occur suddenly. Specifically, there is not a gradual rise in rub and buzz distortion as the amplitude increases, but rather there is an onslaught of rub and buzz distortion whenever the amplitude of the signal exceeds a certain threshold.

Using this novel observation, techniques for maintaining a signal below a threshold can be utilized to control rub and buzz distortion. In one exemplary embodiment involving analog circuitry, such as amplifiers or radio receivers, many components have a linear range of operation with respect to magnitude, frequency, or other signal parameters, so it is important to maintain the magnitude, frequency or other signal parameter of the processed signal within the linear range to control rub and buzz distortion.

FIG. 2 is a diagram of a clipping circuit 200 in an audio path in accordance with an exemplary embodiment of the present invention. The clipping circuit 200 and other circuits and systems described herein can be collections of discrete components, integrated circuits, or can be one or more software systems operating on a suitable hardware platform.

As used herein and by way of example and not by limitation, "hardware" can include a combination of discrete components, an integrated circuit, an application-specific integrated circuit, a field programmable gate array, a general purpose processing or server platform, or other suitable hardware. As used herein and by way of example and not by limitation, "software" can include one or more objects, agents, threads, lines of code, subroutines, separate software applications, one or more lines of code or other suitable software structures operating in one or more software applications or on one or more processors, or other suitable software structures. In one exemplary embodiment, software can include one or more lines of code or other suitable software structures operating in a general purpose software application, such as an operating system, and one or more lines of code or other suitable software structures operating in a specific purpose software application.

One technique for maintaining a signal's amplitude within a certain range is clipping. Whenever a signal amplitude exceeds a threshold, a signal value at or slightly below the threshold is supplied, otherwise the signal is allowed to pass. Mathematically, a clipping function $\mathcal{F}$ can be expressed as:

$$\mathcal{F}(x) = \begin{cases} T_2 & \text{if } x > T_1 \\ x & \text{if } T_1 > x > -T_1 \\ -T_2 & \text{if } x < -T_1. \end{cases}$$

A digital clipping circuit can also be incorporated as part of the digital processing circuitry. While this technique will prevent rub and buzz distortion, it does have the disadvantage that other forms of distortion are introduced. In fact, clipping itself is usually considered an unacceptable form of distortion.

FIG. 3A is a diagram of a basic analog implementation of AGC in an audio path in accordance with an exemplary embodiment of the present invention. AGC is used to control rub and buzz distortion by attenuating the signal based on its amplitude. FIG. 3A shows a basic analog implementation of AGC inserted into the audio path. AGC 310 includes amplifier 302 and gain control circuit 304. Gain control circuit 304 measures the output of amplifier 302 and adjusts amplifier 302 on the basis of the measured signal amplitude.

FIG. 3B is a diagram of a digital implementation of an automatic gain controller (AGC) in accordance with an exemplary embodiment of the present invention. Digital AGC 320 is placed between DAC 104 and digital processing module 102, and can also or alternatively be incorporated as part of digital processing module 102. Although an AGC does not generally create unacceptable distortion in the manner that clipping does, an AGC compresses the dynamic range of the audio signal, which can impair the listening experience.

Another exemplary embodiment of a solution for addressing rub and buzz distortion is to maintain the signal amplitude below a threshold while preserving its spectral characteristics. Phase modification is one exemplary approach that can be used to reduce the overall peak amplitudes without significantly altering the spectral characteristics. In this exemplary embodiment, phase modification can selectively add phase shifts to different frequency components of a signal to prevent the peaks at each frequency from aligning.

Figure 4A:
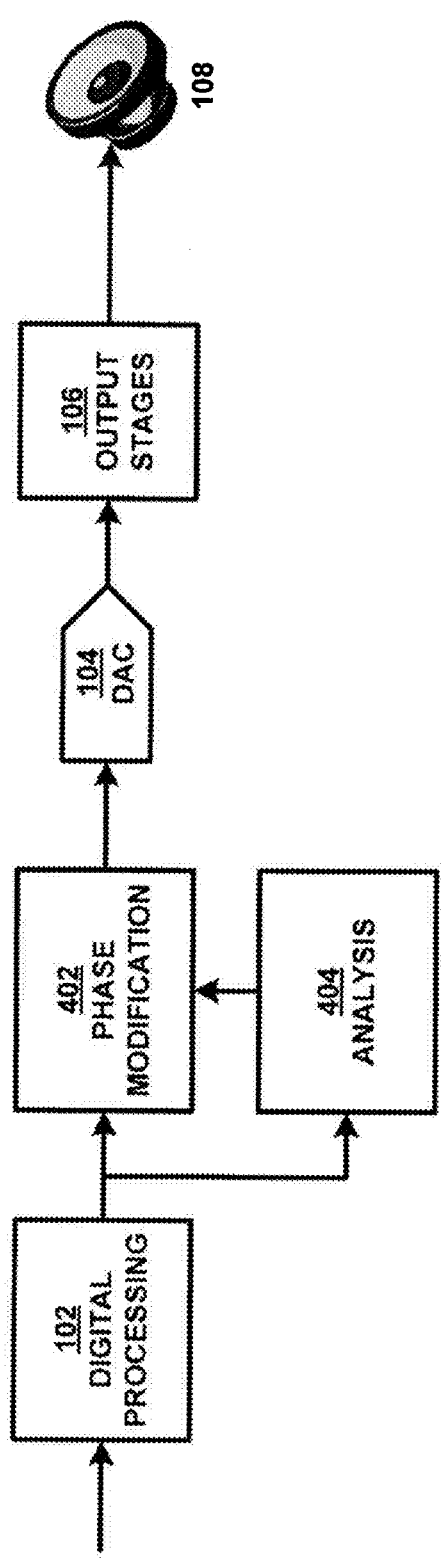
FIG. 4A is a diagram of an audio driver using phase modification to reduce peak amplitudes in accordance with an exemplary embodiment of the present invention.

FIG. 4A is a diagram of an audio driver using phase modification to reduce peak amplitudes in accordance with an exemplary embodiment of the present invention. In addition to the components already described, the driver comprises analysis module 404 and phase modification module 402. Analysis module 404 determines the amplitude and phase of each of the frequency components and can subdivide the time domain signal into a plurality of frames. Analysis module 404 can also determine the optimal phase for each frequency component to result in the smallest overall signal magnitude. These phases are supplied to phase modification module 402, which modifies each phase according to the optimal phase determined by analysis module 404.

While this approach provides certain advantages, the amplitude of a signal might still exceed a predetermined threshold, although this approach reduces the chances of this condition from occurring. Therefore, it is advantageous to compress the amplitude by phase modification.

In some applications such as cellular telephones, cheap speakers are used which may exhibit rub and buzz distortion. However, in such an application, the audio is generally optimized for a particular type of audio signal, namely speech. Phase modification has been used in the past, particularly in speech applications, to minimize the peak amplitude of a signal when the audio signal is predominantly speech. One such method is disclosed in U.S. Pat. No. 4,856,068 which is incorporated by reference.

Figure 4B:
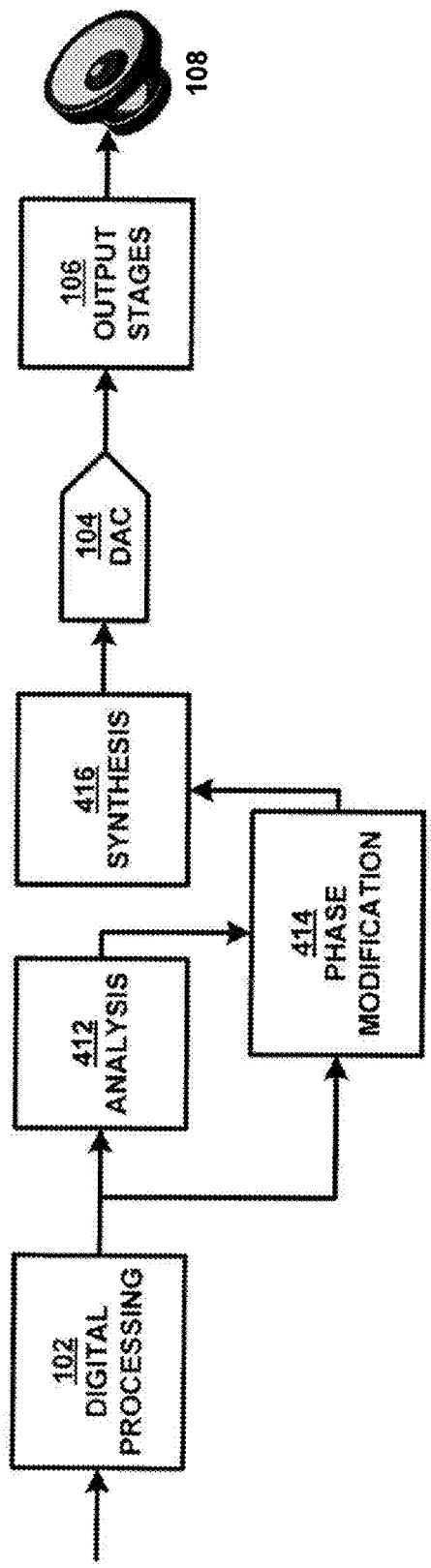
FIG. 4B is a diagram of an audio driver using speech based phase modification in accordance with an exemplary embodiment of the present invention.

FIG. 4B is a diagram of an audio driver using speech based phase modification in accordance with an exemplary embodiment of the present invention. In addition to the components already described, the driver comprises analysis module 412, phase modification module 414, and synthesis module 416. The speech-based phase modification approach breaks down the audio signal into sinusoidal tracks. Human speech can be modeled as a plurality of tracks which have a frequency, an amplitude and phase associated with them. Analysis module 412 subdivides a signal into frames and determines the frequency, amplitude and phase of each track in the frame. Phase modification module 414 uses the frequency, amplitude and phase information of each track, as well as the phase and magnitude response from the loudspeaker displacement transfer function to determine an optimal phase for each track in order to minimize the peak displacement. Across the frame, the frequency, amplitude and optimal phase are interpolated. These revised values are then used by synthesis module 416 to construct a new audio signal which causes lower peak speaker displacement.

In another exemplary embodiment, some of the tracks with lower energy can be omitted to provide greater peak amplitude compression.

Depending on the application, any suitable peak amplitude compressors can be employed to eliminate or reduce rub and buzz distortion. However, phase modification leads to peak amplitude compression with minimal spectral effects.

Because phase modification cannot guarantee compression of the peak displacement below a given threshold, phase modification can be combined with other methods, such as an AGC. By doing so, the impact of the AGC on clipping distortion is reduced, while ensuring that the peak displacement remains below a given threshold.

Figure 5:
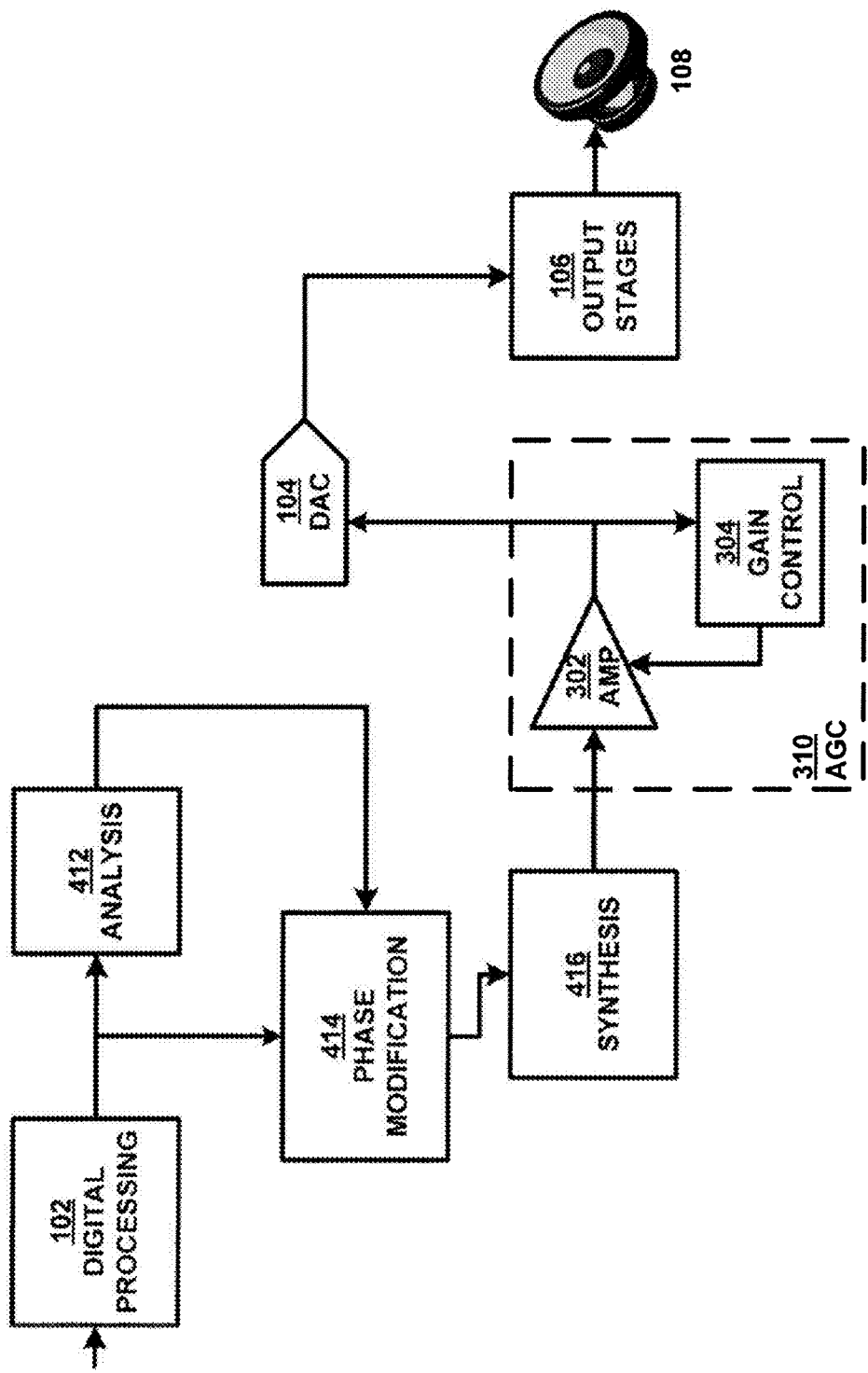
FIG. 5 is a diagram of an audio driver using the phase modification described in FIG. 4B and the AGC shown in FIG. 3 in accordance with an exemplary embodiment of the present invention.

FIG. 5 is a diagram of an audio driver using the phase modification described in FIG. 4B and the AGC shown in FIG. 3 in accordance with an exemplary embodiment of the present invention. The process of optimizing the peak amplitude in a frame can yield the peak amplitude over the frame, so gain control can be performed within the phase modification module.

Figure 6:
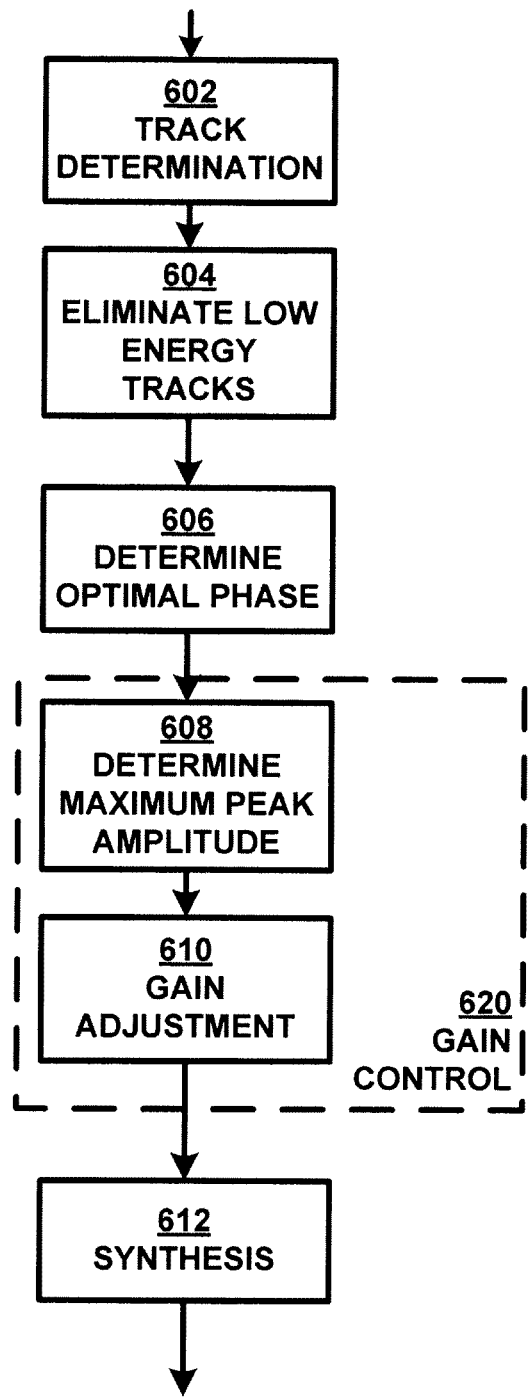
FIG. 6 is a flow chart of a phase modification process with optional enhancements in accordance with an exemplary embodiment of the present invention.

FIG. 6 is a flow chart of a phase modification process with optional enhancements in accordance with an exemplary embodiment of the present invention. In one exemplary embodiment, FIG. 6 can be implemented as an algorithm operating on a general purpose processing platform, as an algorithm operating in conjunction with a plurality of discrete components under centralized control, or in other suitable manners.

At step 602, analysis module 404 subdivides the signal into frames (either overlapping or non-overlapping) and identifies the tracks. Phase modification module 402 or analysis module 404 can optionally eliminate low energy tracks at step 604. At step 606, phase modification module 402 can determine the optimal phases to minimize the peak displacement. Phase modification module 402 can take into account the signal, as well as the displacement transfer function of the loudspeaker. Optionally at step 608, phase modification module 402 can determine the maximum displacement over the frame and at step 610 it can attenuate the entire signal based on the maximum displacement if it exceeds the predetermine threshold. Steps 608 and 610 together represent gain control process 620 mentioned previously. Finally at step 612, synthesis module 406 reconstitutes the signal with appropriate phase shifts and signal attenuation.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. An audio driver for a loudspeaker comprising:
   a digital processing module configured to generate a digital audio signal having a plurality of tracks;
   a phase modification circuit coupled to the output of the digital processing module and configured to receive the digital audio signal and selectively shift a phase for each of the plurality of tracks to minimize peak displacement for the loudspeaker;
   a digital to audio converter (DAC) operable to convert the phase modified digital audio signal supplied by the phase modification circuit to an analog audio signal; and
   one or more analog driver stages operable to receive the analog audio signal supplied by the DAC and drive the loudspeaker;
   wherein the phase modification circuit is further configured to add phase shifts to different frequency components of the audio signal to prevent peaks at each frequency from aligning.

2. The audio driver of claim 1, wherein the phase modification circuit comprises:
   an analysis module configured to subdivide the digital audio signal into a plurality of frames and determine a frequency, amplitude and phase of each track in each frame;
   a phase modification module configured to use the frequency, amplitude and phase information of each track and a phase and magnitude response from a loudspeaker transfer function corresponding to the loudspeaker to determine an optimal phase for each track to minimize the peak displacement of the loudspeaker; and
   a synthesis module configured to construct a phase modified digital audio signal.

3. The audio driver of claim 2 further comprising a clipping circuit coupled to the DAC and the analog driver stages.

4. The audio driver of claim 2 further comprising an analog automatic gain control (AGC) circuit coupled to the DAC and the analog driver stages.

5. The audio driver of claim 2 further comprising a digital AGC circuit coupled to the phase modification circuit and the DAC.

6. A method for reducing rub and buzz distortion in a loudspeaker comprising:
- subdividing an audio signal into a plurality of sinusoidal tracks;
- determining a phase, an amplitude and a frequency for each track;
- optimizing the phase of each track to minimize a peak displacement of the loudspeaker in accordance with a phase and magnitude response from a loudspeaker transfer function;
- selectively shifting a phase for each of the plurality of tracks to minimize peak displacement for the loudspeaker by inhibiting peaks at each frequency from aligning; and
- synthesizing an output audio signal based on the optimal phase, the amplitude and the frequency of one or more tracks.

7. The method of claim 6 wherein subdividing an audio signal into a plurality of sinusoidal tracks further comprises:
- subdividing the audio signal into a frames; and
- determining the plurality of sinusoidal tracks in each frame.

8. The method of claim 7 further comprising zeroing the amplitude of tracks with energy levels below a predetermined level.

9. The method of claim 7 further comprising determining a peak amplitude of the output audio signal.

10. The method of claim 7 further comprising attenuating the amplitudes of all the tracks if the peak amplitude is above a given threshold.

11. A system comprising:
- a loudspeaker having a corresponding loudspeaker transfer function;
- a digital processing module configured to generate a digital audio signal having a plurality of tracks;
- a phase modification circuit configured to receive the digital audio signal and selectively shift a phase for each of the plurality of tracks to minimize peak displacement for the loudspeaker in accordance with the loudspeaker transfer function by inhibiting peaks at each frequency from aligning;
- a digital to audio converter (DAC) operable to convert the phase modified digital audio signal supplied by the phase modification circuit to an analog audio signal; and
- one or more analog driver stages operable to receive the analog audio signal supplied by the DAC and drive the loudspeaker.

12. The system of claim 11, wherein the phase modification circuit comprises:
- an analysis module configured to subdivide the digital audio signal into a frames and determine a frequency, amplitude and phase of each track in each frame;
- a phase modification module configured to use the frequency, amplitude and phase information of each track and a phase and magnitude response from the loudspeaker transfer function to determine an optimal phase for each track to minimize the peak displacement; and
- a synthesis module configured to reconstruct the audio signal.

13. The system of claim 12 further comprising a clipping circuit coupled to the DAC and the analog driver stages.

14. The system of claim 12 further comprising an analog automatic gain control (AGC) circuit coupled to the DAC and the analog driver stages.

15. The system of claim 12 further comprising a digital AGC circuit coupled to the digital processing module and the DAC.

16. The system of claim 12, further comprising an automatic gain control circuit coupled to the synthesis module.

* * * * *